United States Patent
Kai et al.

[11] Patent Number: 5,886,269
[45] Date of Patent: Mar. 23, 1999

[54] SUBSTRATE AND HEAT SINK FOR A SEMICONDUCTOR AND METHOD OF MANUFACTURING THE SAME

[75] Inventors: Yasunao Kai; Akira Mishima; Shinji Gotoh; Chiaki Yamasaki, all of Fukuoka, Japan

[73] Assignee: Nippon Tungsten Co., Ltd., Japan

[21] Appl. No.: 605,542

[22] Filed: Feb. 14, 1996

[30] Foreign Application Priority Data

Feb. 17, 1995 [JP] Japan ................................ 7-053516
Mar. 27, 1995 [JP] Japan ................................ 7-093136

[51] Int. Cl.$^6$ ................................ B22F 3/26; B22F 5/00
[52] U.S. Cl. ................................ 75/245; 75/248
[58] Field of Search ................................ 419/6, 7, 8, 9; 75/245, 248

[56] References Cited

U.S. PATENT DOCUMENTS

| | | | |
|---|---|---|---|
| 4,025,997 | 5/1977 | Gernitis et al. | 428/621 |
| 4,361,720 | 11/1982 | Resneau et al. | 174/164 HS |
| 4,788,627 | 11/1988 | Ehlert et al. | 361/386 |
| 5,561,321 | 10/1996 | Hirano et al. | 257/700 |
| 5,601,924 | 2/1997 | Beane et al. | 428/403 |
| 5,614,043 | 3/1997 | Ritland et al. | 156/89 |
| 5,614,320 | 3/1997 | Beane et al. | 428/403 |

FOREIGN PATENT DOCUMENTS

| | | |
|---|---|---|
| 3-36304 | 5/1991 | Japan . |
| 3-36305 | 5/1991 | Japan . |
| 6-13494 | 1/1994 | Japan . |

*Primary Examiner*—Daniel J. Jenkins
*Attorney, Agent, or Firm*—Evenson, McKeown, Edwards & Lenahan, P.L.L.C.

[57] ABSTRACT

A substrate serving as a heat sink for a semiconductor efficiently radiates heat from a semiconductor element mounted thereon. The substrate consists of a composite alloy metal which consists of a sintered body of a metal powder having a high melting point such as W and Mo impregnated with a filling metal such as Cu and Ag, wherein the sintered body of a metal powder having a high melting point has a grain size composition of a combination of a plurality of powder groups having statistically different average grain sizes from group to group, and the powder of each group is dispersed uniformly.

4 Claims, 7 Drawing Sheets

50 μm

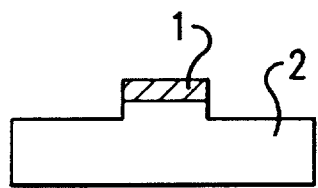 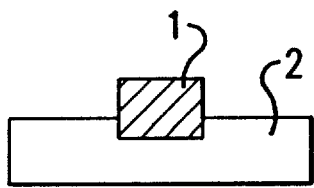 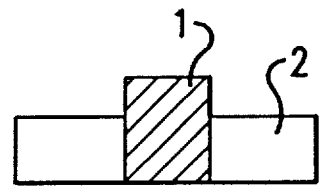
FIG.6A  FIG.6B  FIG.6C
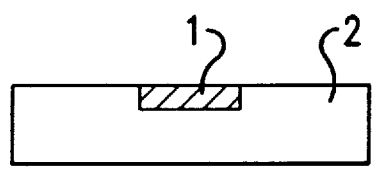 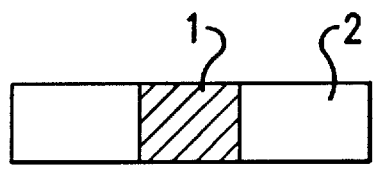
FIG.7A  FIG.7B
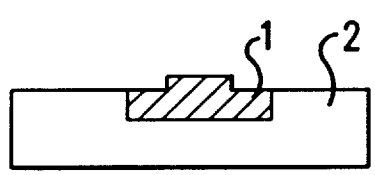 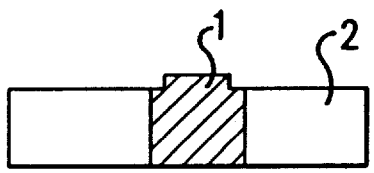
FIG.8A  FIG.8B
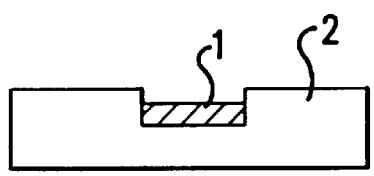 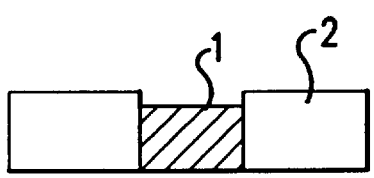
FIG.9A  FIG.9B

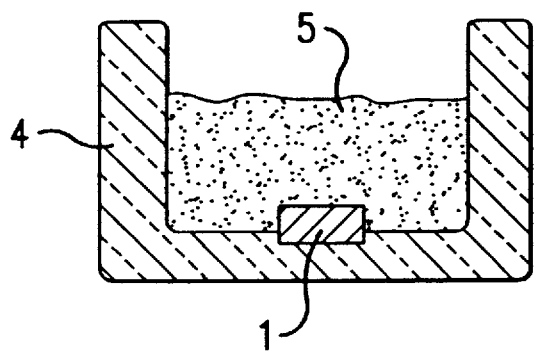
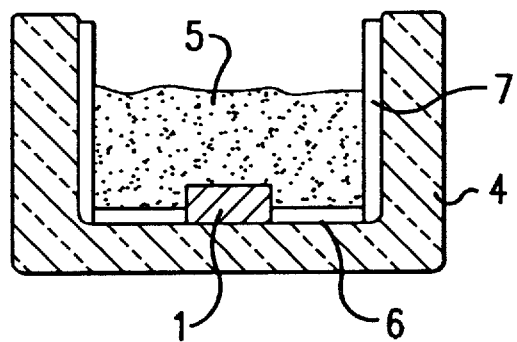
FIG.10A   FIG.10B
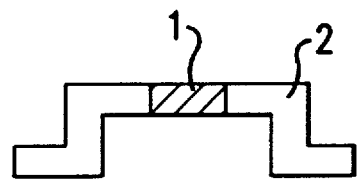
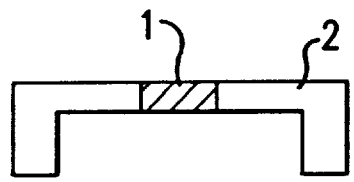
FIG.11A   FIG.11B
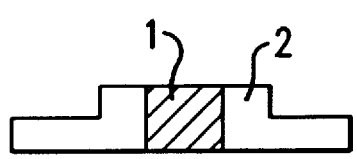
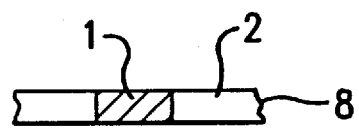
FIG.11C   FIG.11D

SUBSTRATE AND HEAT SINK FOR A SEMICONDUCTOR AND METHOD OF MANUFACTURING THE SAME

BACKGROUND OF THE INVENTION

1. Field of the Invention

The present invention relates to a substrate and a heat sink for a semiconductor suitable for integrated circuits, and to a method of manufacturing the heat sink.

2. Description of the Related Art

Conventionally, Cu-type, Mo-type and W-type substrates have been used as heat sinks for semiconductors such as integrated circuit chips. These substrates are plated with Ni and then joined with packaging parts made of ceramics or with semiconductor elements.

Although a Cu substrate has high thermal conductivity and therefore an excellent heat radiating performance, the coefficient of thermal expansion of the Cu substrate is several times greater than that of the ceramic packaging part or semiconductor element to be joined with the substrate. Therefore, when a semiconductor element is mounted on the Cu substrate, deterioration of the brazed portion is accelerated due to distortion caused by the difference between the coefficients of thermal expansion. In contrast, W substrates and Mo substrates have relatively small coefficients of thermal expansion, so these substrates have excellent durability after being joined with semiconductor elements or ceramics parts by brazing. However, since W substrates and Mo substrates have small thermal conductivity, their heat radiating performances are insufficient.

Because of the above, there have been attempts to make composites of Cu and W or of Cu and Mo to obtain a substrate for a semiconductor which has excellent characteristics and takes advantage of the features of each respective material.

Composites of Cu and W or of Cu and Mo are made using an infiltration method, one of several powder metallurgical methods, in which Cu is infiltrated into a sintered body or a preliminary sintered body of powder of W or Mo, or by a method in which they are joined together using a clad.

However, because of insufficient dimensional accuracy, the clad method requires precise machining. Thus, joining cannot be performed with high reliability, and costs increase. Moreover, it is difficult to obtain an elongated plate by rolling a sintered ingot of W or Mo. In addition, mechanical joining with Cu is difficult because of the presence of a hard oxide film or layer. In view of the foregoing drawbacks, the infiltration method is now widely used, as described in, for example, Japanese Patent Publication Nos. 3-36304 and 3-36305, and Unexamined Japanese Patent Publication No. 6-13494.

The infiltration method, though, requires a complex process, and also requires adjustment of the density of a sintered body by shrinkage during sintering in cases where the content of Cu is not greater than 20 wt. %, because the desired density cannot be obtained in a green compact. In such cases, it is difficult to control heating conditions and to obtain a predetermined amount of shrinkage. Thus, the density and dimensions of the sintered body after shrinkage vary, affecting the coefficient of thermal expansion and thermal conductivity, and resulting in uneven quality.

Meanwhile, as the sizes of semiconductor elements and the density of integration are increased to cope with enhanced functions, the amount of heat generated by the semiconductor elements also increases. Thus, it becomes more important to release Joule heat generated in the semiconductor elements to maintain the predetermined functions. Accordingly, a substrate serving as a heat sink and having improved heat conductivity and heat radiating performance has been desired.

SUMMARY OF THE INVENTION

An object of the present invention is to provide an improved substrate for a semiconductor which can efficiently radiate heat from a semiconductor element mounted thereon, and which has a coefficient of thermal expansion close to that of the semiconductor elements, uniform density, and improved dimensional accuracy.

Another object of the present invention is to provide an improved heat sink especially suitable for high density semiconductor elements, in which a mounting portion having a coefficient of thermal expansion similar to that of the semiconductor element and a heat radiating portion providing superior heat conductivity are closely connected to each other.

Still another object of the present invention is to provide a method of manufacturing the above-described improved heat sink.

According to a first aspect of the present invention, there is provided a substrate for a semiconductor, consisting of a composite alloy metal which consists of a sintered body of a metal powder having a high melting point such as W and Mo impregnated with a filling metal such as Cu and Ag, wherein the sintered body of a metal powder having a high melting point has a grain size composition of a combination of a plurality of powder groups having statistically different average grain sizes from group to group, with powder from each group being dispersed uniformly.

Preferably, the grain size composition of a combination of a plurality of powder groups is a combination of groups of a larger grain size and a smaller grain size. The larger grain size is in the range of 7 µm to 15 µm and the smaller grain size is in the range of 0.5 µm to 1.0 µm. The grain size composition is composed of from 70 vol. % to 85 vol. % of the larger grain size with the balance made up of the smaller grain size.

Preferably, the grain size composition of a combination of a plurality of powder groups is a combination of groups of a larger grain size, middle grain size and a smaller grain size. The larger gain size is in the range of 7 µm to 15 µm, the middle grain size is in the range of 2 µm to 4 µm, and the smaller grain size is in the range of 0.5 µm to 1.0 µm. The grain size composition is composed of from 60 vol. % to 80 vol. % of the larger grain size, 10 vol. % to 25 vol. % of the smaller grain size and the balance of the middle grain size.

Preferably, the mounting portion is composed of a material having a coefficient of thermal expansion which is similar to that of the semiconductor element to be mounted thereon, while the heat radiating portion is composed of a material having high thermal conductivity and heat radiating ability. The mounting portion and heat radiating portion are physically closely connected.

Preferably, at least the mounting portion of the substrate according to the invention is composed of a composite alloy of a sintered powder of a metal having a high melting point such as W and Mo impregnated with a filling metal such as Cu and Ag.

Preferably, the sintered body of a metal powder having a high melting point has a grain size composition of a combination of a plurality of powder groups having statistically different average grain sizes from group to group, with the powder of each group dispersed uniformly.

The substrates according to the first aspect of the present invention have the following advantages.

(1) Shrink sintering for adjusting the size of a sintered body is not required, and the shrinkage after infiltration of Cu into a green compact can be reduced to substantially zero. Accordingly, machining for finishing can be eliminated.

(2) Since the density (filling rate) can be controlled in the stage where the green compact is pressed, variations in the composition of a product can be decreased.

(3) Although the coefficient of thermal expansion increases slightly due to use of larger grains, the thermal conductivity increases so that a substrate for a semiconductor having increased thermal conductivity can be obtained.

(4) Since variations in the composition are small, variations in the coefficient of thermal expansion and thermal conductivity can be decreased, so that a substrate for a semiconductor having improved quality can be obtained.

According to a second aspect of the present invention, there is provided a heat sink and a method of manufacturing a heat sink. The heat sink. comprises a mounting portion made of a material having a coefficient of thermal expansion similar to that of the semiconductor element to be mounted thereon, and a heat radiating portion made of a material having high heat conductivity and heat radiating performance, and in which the mounting portion and the heat radiating portion are closely connected to each other.

The mounting portion is made of W, a Cu-W composite material containing 14–35 vol. % of Cu, Mo, a Cu-Mo composite material containing 14–35 vol. % of Cu, a W type alloy containing 8–24 vol. % of Cu, 6–11 vol. % of Ni and a balance of W, or the like. When only W or Mo are used for the mounting portion, a material having a theoretical density of 97% or more is preferably used so as to suppress the effect of pores which degrade thermal conductivity. The heat radiating portion is made of Cu, a Cu alloy, Ag, an Ag alloy, Al, an Al alloy, or the like.

The heat sink of the present invention is manufactured by a method in which the mounting member made of a material having a coefficient of thermal expansion similar to that of the semiconductor element to be mounted thereon and a heat radiating material for forming a heat radiating member having high heat conductivity and heat radiating performance are placed into a container having low wettability, and heated in a non-oxidizing or reduction atmosphere to a temperature equal to or greater than the melting point of the heat radiating member. Due to the heat, an infiltration juncture layer or a direct joint surface is formed at the interface between the mounting member and the heat radiating member.

A powdery, granular and/or chip-like material having high thermal conductivity, such as Cu, a Cu alloy, Ag, an Ag alloy, or the like is used as the material for the heat radiating member (hereinafter referred to as "heat radiating material"). The heat radiating material is charged into a container made of graphite or ceramics into which the mounting member has been previously placed. Subsequently, the heat radiating material is entirely pressed for forming, if necessary, and is heated to a temperature equal to or greater than the melting point of the heat radiating material, so that the heat radiating member is directly joined to the mounting member.

When Cu is impregnated into a porous body of W or Mo, by infiltration or penetration, to obtain a mounting member, and the mounting member is then joined with the heat radiating member, the porosity is preferably maintained in the range of 14–35 vol. % before being joined with the heat radiating member.

The heat radiating member to which the mounting member has been joined is formed in a predetermined shape by forging if necessary. Alternatively, threads are formed on the circumferential surface of the heat radiating member to facilitate attachment to peripheral devices.

As described above, in the heat sink according to the second aspect of the present invention, a mounting member containing W, Mo, and the like and having a coefficient of thermal expansion similar to that of the semiconductor element, and a heat radiating member made of a material having high heat radiating performance are directly joined to each other. Therefore, no pores exist at the interface between the mounting member and the heat radiating member which would degrade thermal conductivity and thermal transmission, so that heat transmitted from the semiconductor element to the mounting member is efficiently released to the outside via the heat radiating member. Accordingly, even when the semiconductor element has a high integration density, it provides the desired performance without causing variations in thermal resistance at the juncture. Also, in the manufacturing method according to the present invention, the heat radiating member is directly joined to the mounting member. Therefore, a heat sink having high heat radiating performance can be easily manufactured without using brazing, hot press, or similar methods. In addition, expensive materials such as W and Mo are used in small amounts and the obtained heat sink is lightweight and has excellent machinability. Therefore, the heat sink of the present invention can be suitably used as a mount substrate for a high performance element which generates a large amount of heat. Moreover, it has the advantage of having fewer portions which require machining.

BRIEF DESCRIPTION OF THE DRAWINGS

FIGS. 6A through 6C are illustrations showing three examples of heat sinks in which the surface of the mounting member is projected from the surface of the heat radiating member;

FIGS. 7A and 7B are illustrations showing two examples of heat sinks in which the surface of the mounting member is flush with the surface of the heat radiating member;

FIGS. 8A and 8B are illustrations showing two examples of heat sinks in which part of the mounting member is projected;

FIGS. 9A and 9B are illustrations showing two examples of heat sinks in which the surface of the mounting member is recessed from the surface of the heat radiating member;

FIGS. 10A and 10B are illustrations showing the method of manufacturing a heat sink, wherein FIG. 10A shows an example in which a mounting member is placed into a depression provided in the bottom surface of a container, and FIG. 10B shows an example in which heat resisting spacers are used;

FIGS. 11A through 11C are illustrations showing examples in which a heat radiating member to which a mounting member has been joined is formed in a predetermined shape by forging; and FIG. 11D is an illustration showing an example in which a heat radiating member to which a mounting member has been joined is formed in a predetermined shape by threading.

DESCRIPTION OF PREFERRED EMBODIMENTS

Embodiments of the present invention will be described with reference to the accompanying drawings.

In first and second embodiments according to a first aspect of the present invention, W is used as a metal having a high melting point and Cu is used as a filling metal to make substrates for semiconductors.

Figure 1:
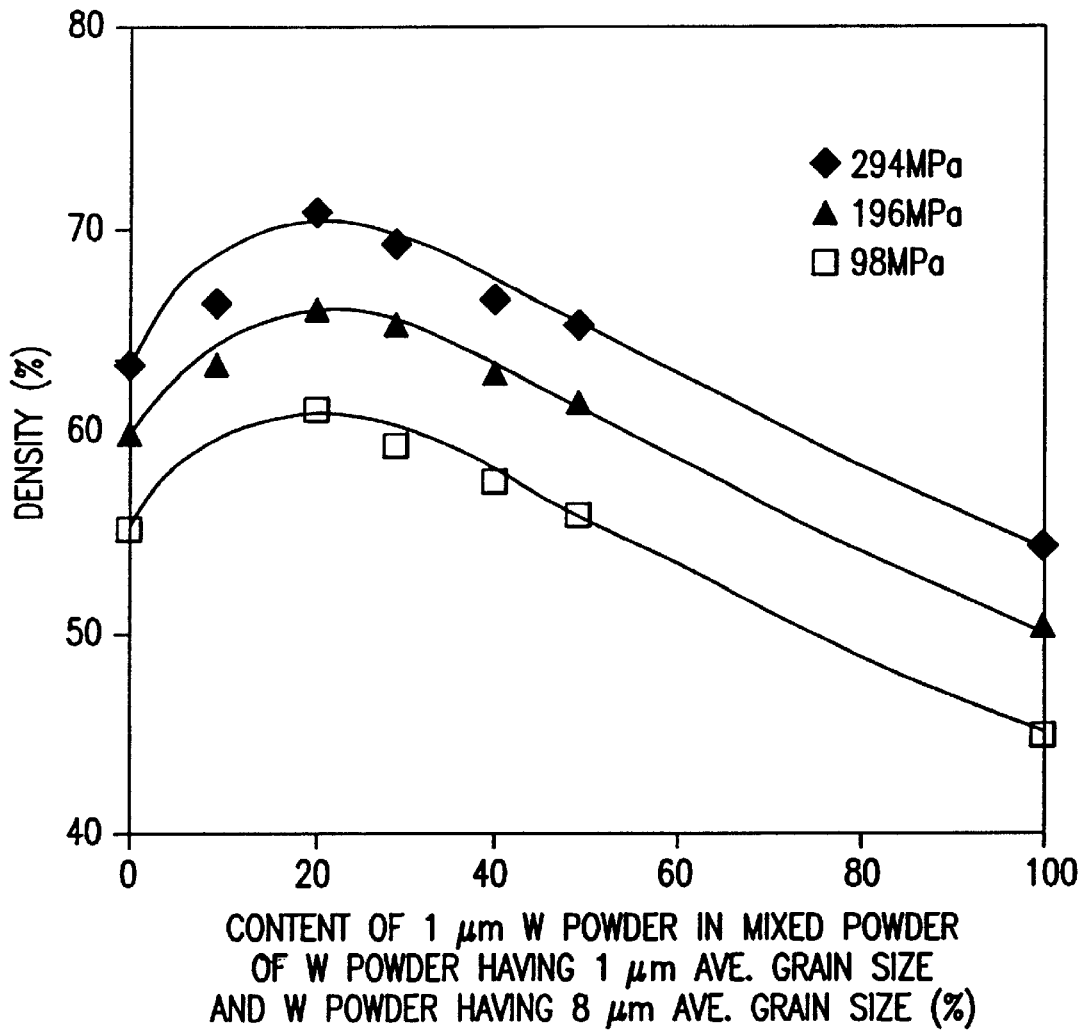
FIG. 1 is a graph showing the relationship between the content of 1 $\mu$m W powder and the density of each green compact obtained in the case where larger grains and smaller grains are combined.

First Embodiment:

One wt. % of a paraffin wax was added to a powder of W which contained 80 vol. % of larger grain powder having an average grain size of 8 $\mu$m as the larger grain group, and 20 vol. % of smaller grain powder having an average grain size of 1 $\mu$m as the smaller grain group, which were then mixed for one hour in a mixer. The obtained powder was pressed using a powder forming press with a pressure of 98, 196 or 294 MPa to obtain a green compact measuring 40 mm in length, 40 mm in width and 3 mm in thickness. FIG. 1 shows the density of the obtained green compact. The x-coordinate represents the content of the smaller grain powder having an average grain size of 1 $\mu$m, while the y-coordinate represents the obtained density represented as a percentage of the theoretical density. As can been seen from FIG. 1, the density of the green compact pressed with a pressure of 98 MPa was 11.78 g/cm$^3$ and was 61% of the theoretical density. This green compact was pre-baked at 800° C. in a hydrogen atmosphere for dewaxing. Further, the green compact was heated to 1100° C. in a hydrogen atmosphere to carry out a secondary baking. The obtained pre-sintered body had neither shrinkage nor deformation, and had a density which was given thereto during the green compact forming stage. A sufficient amount of pure copper to be infiltrated was placed on the pre-sintered body, which was then heated to 1100° C. in a hydrogen atmosphere for the infiltration, thereby obtaining a substrate. The density of the substrate was 15.25 g/cm$^3$ and the content of copper was 21%. The variation in density was 0.03 g/cm$^3$ with the $\sigma_{n-1}$ variance being 0.0051, and the variation in the longitudinal dimension was 0.05 mm with the $\sigma_{n-1}$ variance being 0.0087.

Figure 5A:
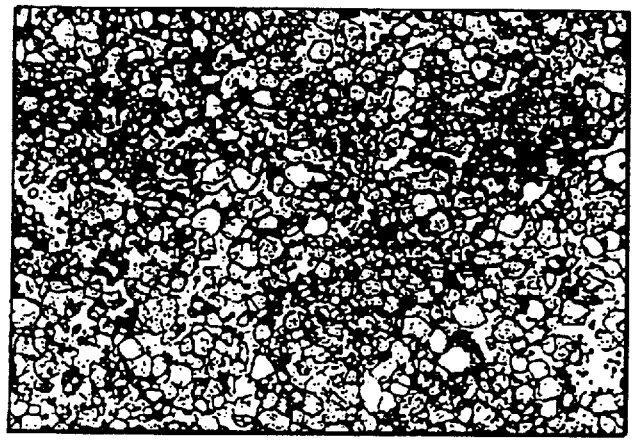
FIG. 5A shows the texture of a substrate of the present invention.
Figure 5B:
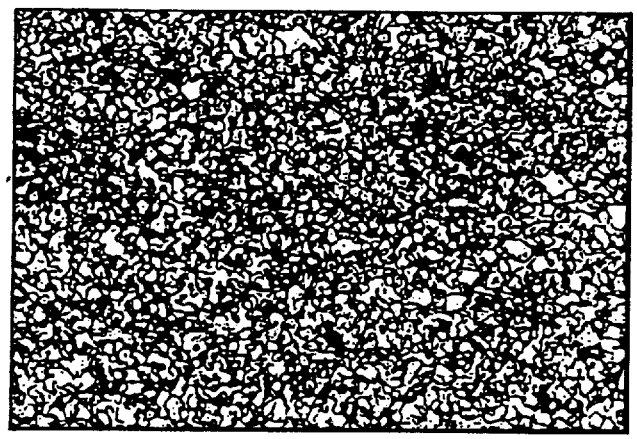
FIG. 5B shows the texture of a substrate of a comparative sample (conventional product)

Separately, a substrate was manufactured in a conventional manner, using a powder of W having an average grain size of 3 $\mu$m, as a comparative sample. The variation in density of the substrate was 0.17 g/cm$^3$ with the $\sigma_{n-1}$ variance being 0.025, and the variation in the longitudinal dimension was 0.13 mm with the $\sigma_{n-1}$ variance being 0.025. The density of the green compact can be freely adjusted to be 60–72% of the theoretical density by changing the pressure for press-forming in the range of 95–300 MPa. The textures of the substrate of the present invention and of the substrate of the comparative sample (conventional product) are shown in FIGS. 5A and 5B, respectively.

Figure 2:
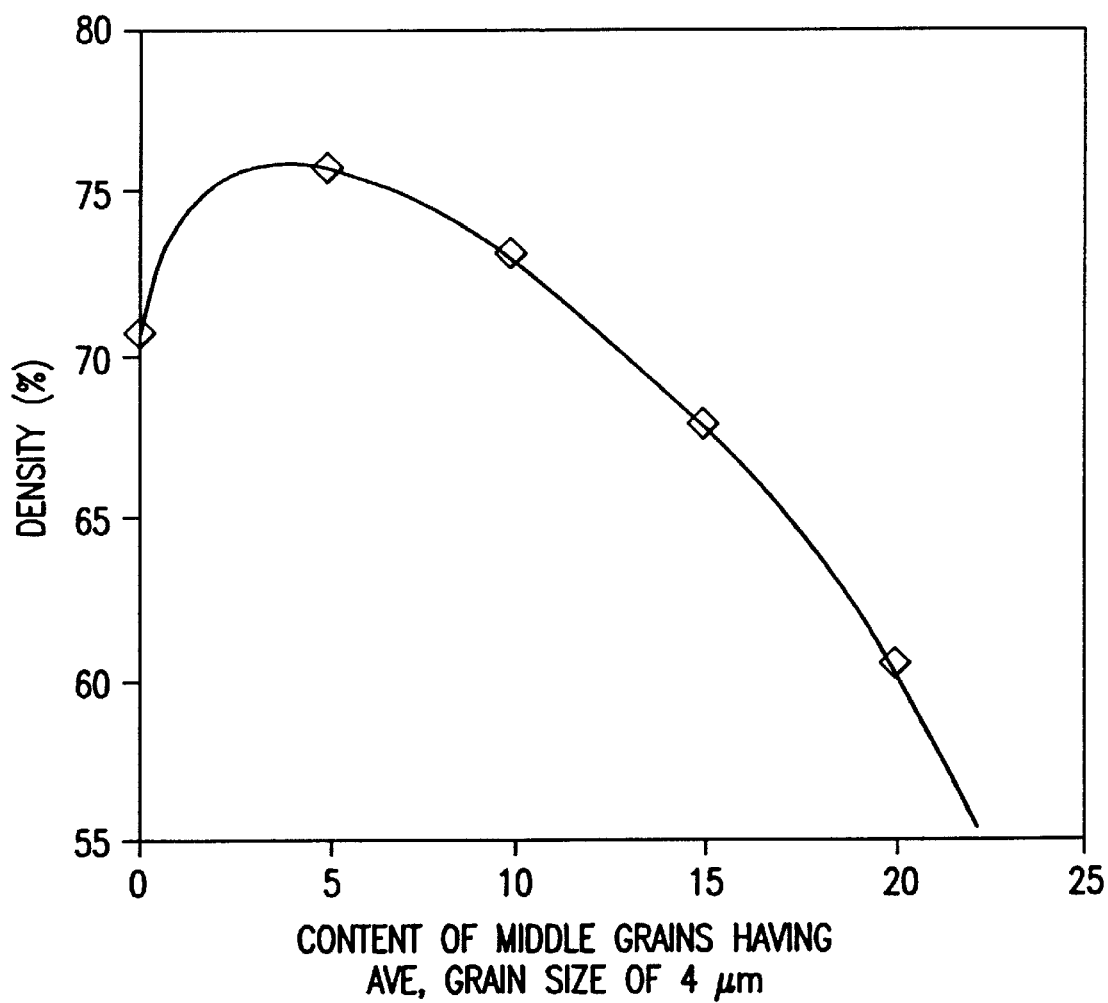
FIG. 2 is a graph showing the relationship between the content of 4 $\mu$m W powder and the density of each green compact obtained in the case where larger grains, middle grains and smaller grains are combined.

Second Embodiment:

One wt. % of a paraffin wax was added to a powder of W which contained 76 vol. % of larger grain powder having an average grain size of 8 $\mu$m as the larger grain group, 19 vol. % of smaller grain powder having an average grain size of 1 $\mu$m as a smaller grain group, and 5 vol. % of middle grain powder having an average grain size of 4 $\mu$m as the middle grain group, which were then mixed for one hour in a mixer. The obtained powder was pressed using a powder forming press with a pressure of 294 MPa to obtain a green compact measuring 40 mm in length, 40 mm in width and 3 mm in thickness. FIG. 2 shows the density of the obtained green compact. The x-coordinate represents the content of the middle grain powder having an average grain size of 4 $\mu$m, while the y-coordinate represents the obtained density represented as a percentage of the theoretical density. As can been seen from FIG. 2, the density of the green compact was 14.67 g/cm$^3$ and was 76% of the theoretical density. This green compact was pre-baked at 800° C. in a hydrogen atmosphere for dewaxing. The green compact was then heated to 1200° C. in a hydrogen atmosphere to carry out a secondary baking. The obtained pre-sintered body had neither shrinkage nor deformation, and had a density which was given thereto during the green compact forming stage. A sufficient amount of pure copper to be infiltrated was placed on the pre-sintered body, which was then heated to 1100° C. in a hydrogen atmosphere for the infiltration, thereby obtaining a substrate. The density of the substrate was 16.25 g/cm$^3$ and the content of the copper was 15%. The variation in the density was 0.05 g/cm$^3$ with the a variance being 0.0059, and the variation in the longitudinal dimension was 0.05 mm with the $\sigma_{n-1}$ variance being 0.0084.

Separately, a substrate was manufactured in a conventional manner, using a powder of W having an average grain size of 3 $\mu$m with a normal distribution, as a comparative sample. The variation in density of the substrate was 0.13 g/cm$^3$ with the a variance being 0.031, and the variation in the longitudinal dimension was 0.12 mm with the $\sigma_{n-1}$ variance being 0.024.

Next, the powders used in Embodiments 1 and 2 were subjected to pressing at various pressures to obtain green compacts whose copper contents became 15 wt. %, 20 wt. %, 30 wt. % and 40 wt. %, respectively, after infiltration. These green compacts were subjected to primary pre-sintering, secondary pre-sintering, and infiltration under the same conditions as those in the above-described embodiments.

Figure 3:
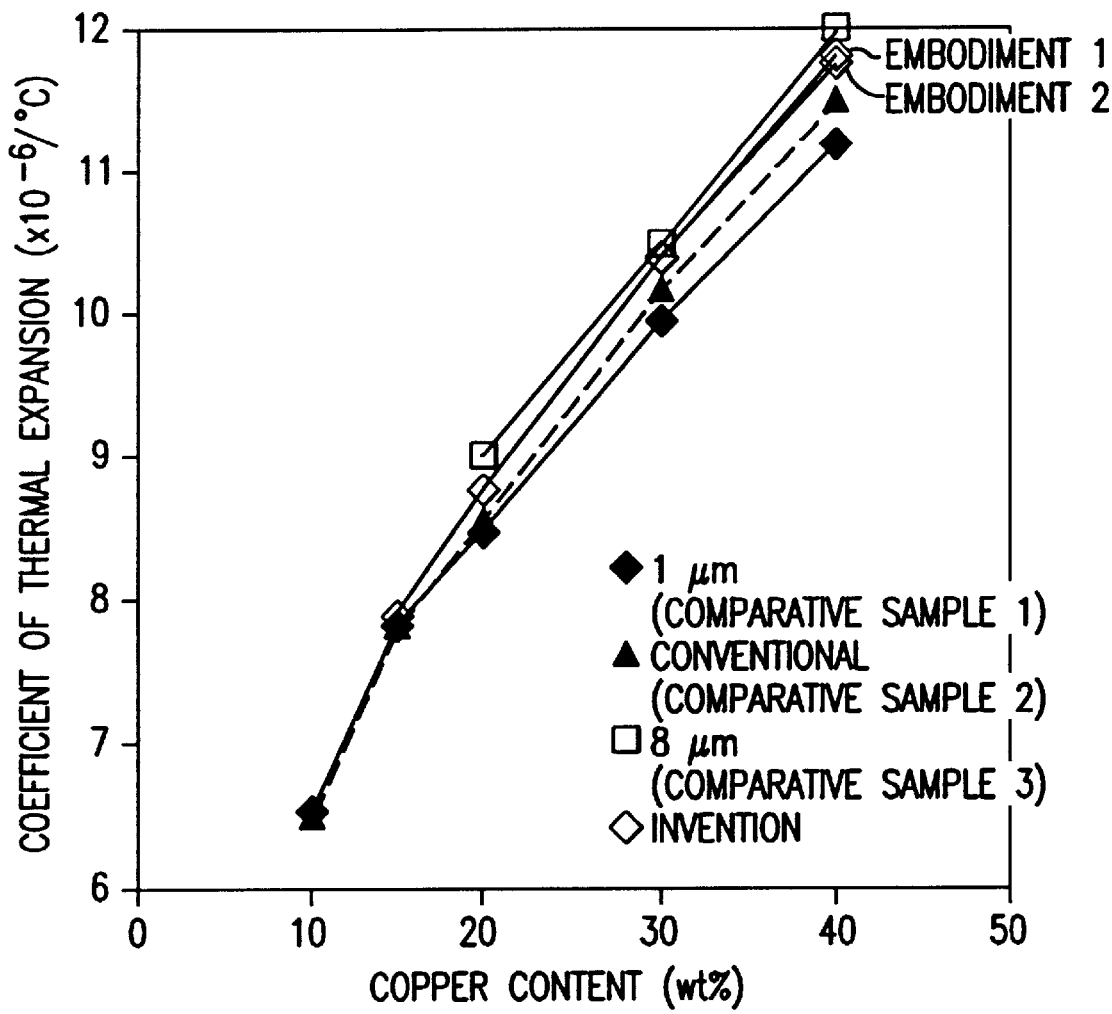
FIG. 3 is a graph showing the coefficients of thermal expansion of obtained substrates for a semiconductor together with those of comparative samples.
Figure 4:
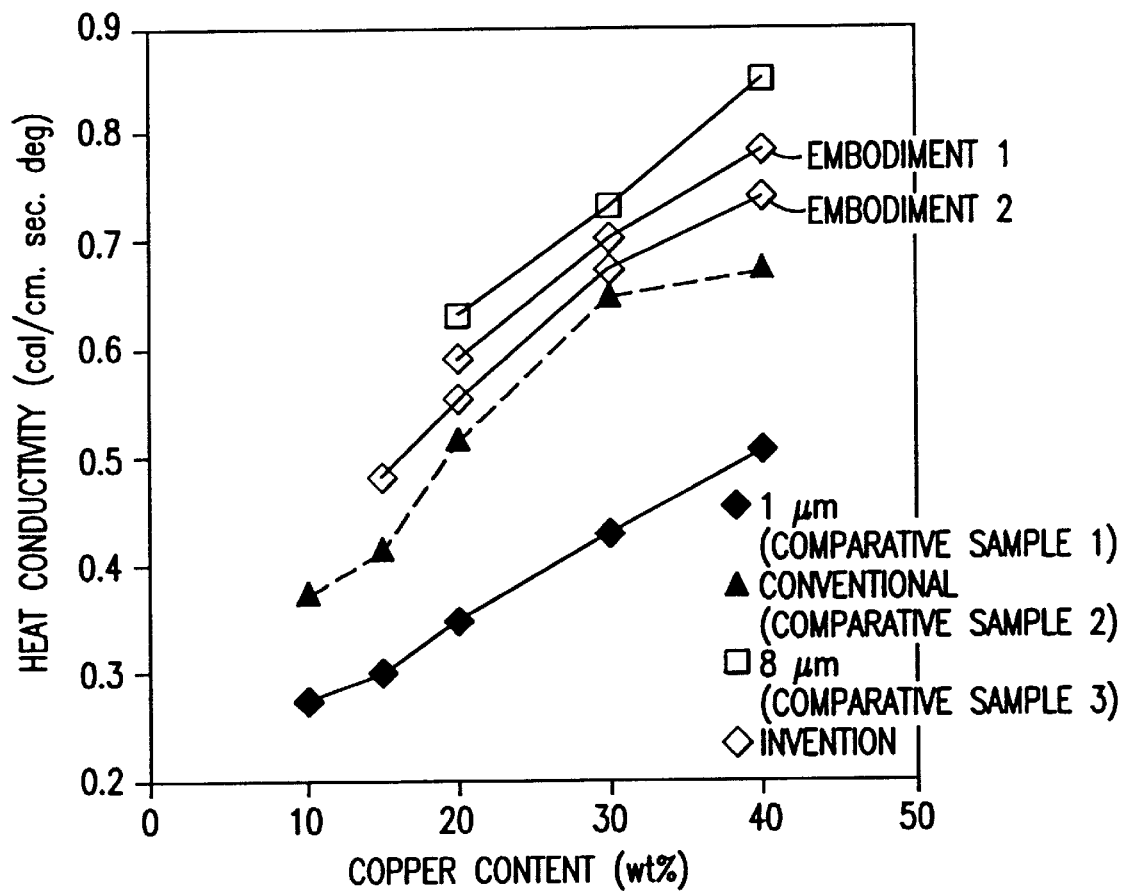
FIG. 4 is a graph showing the thermal conductivity of obtained substrates for a semiconductor together with those of the comparative samples.

FIGS. 3 and 4 shows the relationship between the copper content and coefficient of thermal expansion and thermal conductivity of the substrates which were obtained in the above-described manner.

As a comparative sample 1, substrates were made using a powder of W which contained only grains having a grain size of 1 $\mu$m. In this case, the pressure and the conditions of the pre-sintering were changed so as to obtain pre-sintered bodies having copper contents of 10 wt. %, 15 wt. %, 20 wt. %, 30 wt. % and 40 wt. %, respectively. These pre-sintered bodies were subjected to infiltration under the same conditions as in the embodiments 1 and 2, thereby manufacturing substrates.

As a comparative sample 2, substrates were made using a powder of W having a grain size of only 3 $\mu$m in the same manner as the method described above.

As a comparative sample 3, substrates were made using a powder of W having a grain size of only 8 μm. In this case, the powder was subjected to pressing at various pressures to obtain green compacts whose copper contents became 20 wt. %, 30 wt. % and 40 wt. %, respectively, after infiltration. These green compacts were subjected to primary presintering, secondary presintering, and infiltration under the same conditions as those in the above-described embodiments.

It is evident from these drawings that coefficients of thermal expansion, and thermal conductivity of the substrates made from 1 μm grains are both smaller than those of the substrates made from 8 μm grains. The grain sizes of the substrates according to the embodiments of the present invention and the gain size of the conventional substrate are between the above-mentioned two grain sizes, and the substrates according to the first embodiment of the present invention contain a greater amount of larger grains of 8 μm compared to the substrates of the second embodiment. Therefore, the substrates according to the first embodiment have larger coefficients of thermal expansion and greater thermal conductivity, compared to the substrates of the second embodiment.

Comparing the comparative sample 1 with the comparative sample 3, the difference between the coefficients of thermal expansion is greater than the difference between thermal conductivity. This means that even when a composition of the product according to the present invention is determined to have the same coefficient of thermal expansion as a conventional product, the product according to the present invention has a coefficient of thermal expansion greater than that of the conventional product. Further, by adjusting the content ratio between the larger grain group, the middle grain group, and the smaller grain group, the density of the green compact was able to be increased to 80% of the theoretical density. When a high coefficient of thermal expansion is required for a copper content equal to or greater than 20 wt. %, the first embodiment of the present invention can provide a substrate having higher thermal conductivity compared the second embodiment. In contrast, the second embodiment can provide substrates having copper contents in the range of 10 wt. % to 20 wt. %, which cannot be made by the first embodiment and which have higher thermal conductivity compared to the conventional substrates.

Next, a second aspect of the present invention will be described.

When a Cu—W composite material or a Cu—Mo composite material is used as a material for a mounting member, it is preferable to use a Cu—W composite material including 14–35 vol. % of Cu, a Cu—Mo composite material including 14–35 vol. % of Cu, or a W type alloy including 8–24 vol. % of Cu, 6–11 vol. % of Ni and balance of W. When a porous material is used and the content of Cu is less than 14 vol. %, the spaces within the W or Mo skeleton become closed spaces, and Cu cannot infiltrate therein. Therefore, a homogeneous composite material cannot be obtained. In contrast, when the content of Cu exceeds 35 vol. %, the coefficient of thermal expansion increases, so that it becomes unsuitable for use as a mounting substrate.

When the mounting member has been previously coated with Ni, Fe, Co, or the like, mutual diffusion between the mounting member and the heat radiating member is promoted, so that a stronger connection is formed. To perform coating with a ferrous material, plating, thermal spraying, evaporation, CVD, PVD, or the like is performed.

After the mounting member is joined to the heat radiating member, the heat sink may be formed, by forging or the like, in a shape which matches the peripheral devices used when the heat sink is built in an electronic apparatus. For example, both side portions of a heat radiating member 2 are bent downward and then in horizontal directions (FIG. 11A), or are bent downward once (FIG. 11B). Alternatively, both sides of heat radiating member 2 are thinned (FIG. 11C) When forging is performed, a heat sink material is placed into a forging die, and then pressed for bending. At this time, the heat sink or the forging die must be maintained in the range of room temperature to 200° C. When a lot of machining is performed, there is a possibility that defects such as cracks may be produced in the heat radiating member during forming. Therefore, bending for forming or the like is performed in a single operation in a state in which the heat radiating material is softened or in a few operations. When there is little machining, formation can be performed at room temperature. However, machinability can be increased by heating the heat radiating member. The heat radiating member is machined and hardened by the above-described forging, so that resistance against deformation after forging increases, and the shape is stabilized. Moreover, since the cutting machinability is increased by hardening, the forging makes post-machining easier.

It is possible to form a threaded portion 8 in the side surface of the heat radiating member 2 to facilitate attachment of the heat sink. In this case, the heat radiating material 2 is made of Cu, a Cu alloy, Ag, an Ag alloy, or the like. Therefore, the threaded portion 8 can be easily formed.

The heat sink according to the second aspect of the present invention is formed by unifying a mounting member and a heat radiating member via direct joint. The mounting member and the heat radiating member are combined in various ways as shown in FIGS. 6A through 9B, taking into account the structure of the semiconductor device.

FIGS. 6A and 6B show examples of heat sinks in which the surface of the mounting member 1 is projected from the surface of the heat radiating member 2. In the example shown in FIG. 6A, the mounting member 1 is provided only at the surface portion of the heat radiating member 2. In the example shown in FIG. 6B, the lower portion of the mounting member 1 is embedded into the heat radiating member 2. In the example shown in FIG. 6C, the mounting member 1 penetrates the heat radiating member 2.

FIGS. 7A and 7B show examples of heat sinks in which the surface of the mounting member 1 is flush with the surface of a heat radiating member 2. In the example shown in FIG. 7A, the mounting member 1 is embedded into the heat radiating member 2. In the example shown in FIG. 7B, the mounting member 1 penetrates the heat radiating member 2.

FIGS. 8A and 8B show examples of heat sinks in which part of the mounting member 1 is projected. In the example shown in FIG. 8A, the mounting member 1 is embedded into the heat radiating member 2. In the example shown in FIG. 8B, the mounting member 1 penetrates the heat radiating member 2.

FIGS. 9A and 9B show examples of heat sinks in which the surface of the mounting member 1 is below the surface of the heat radiating member 2. In the example shown in FIG. 9A, the mounting member 1 is received in a depression formed in the heat radiating member 2. In the example shown in FIG. 9B, the mounting member 1 penetrates the heat radiating member 2.

The method of combining the mounting member 1 and the heat radiating member 2 is properly determined by taking into account the structure of a semiconductor device to be manufactured, the manufacturing process to be used, etc.

Also, it is possible to use as a mounting member a laminate of W or Mo and a Cu—W composite material or Cu—Mo composite material. Regardless of the method of combination, the mounting member 1 and the heat radiating member 2 are directly joined to each other so that no clearance is formed at the juncture interface therebetween.

Since the mounting member 1 is directly joined to the heat radiating member 2, heat is efficiently transmitted from the mounting portion 1 to the heat radiating member 2 via the juncture interface. The strong direct joint prevents the generation of defects such as cracks at the juncture interface due to thermal stress caused by an increase in the temperature of a semiconductor device. Also, since pores which decrease the coefficient of thermal conductivity do not exist at the juncture interface, heat is effectively transmitted from the mounting member 1 to the heat radiating member 2.

A direct joint between the mounting member 1 and the heat radiating member 2 is obtained by a diffusion welding method. For example, when a heat sink having the structure shown in FIG. 6B is manufactured, a container 4 made of graphite or ceramics which has low wettability against a molten metal is used, as shown in FIG. 10A. A mounting member 1 is placed into a depression provided in the bottom surface of the container 4, and a heat radiating material 5 is charged into the container 4. At this time, the gap formed between the surface of the depression and the mounting member 1 is made to be as small as possible. Cu, a Cu alloy, Ag, an Ag alloy, and the like are used as the heat radiating material 5.

The container 4, housing the mounting member 1 and the heat radiating material 5, is heated to a temperature equal to or greater than the melting point of the heat radiating material 5 in a non-oxidizing or reduction atmosphere such as nitrogen or hydrogen. Since hydrogen is absorbed by Cu during the heating step, an additional processing step is sometimes required to remove the absorbed hydrogen after the heating step. Therefore, an inert gas such as nitrogen or argon is preferably used as the atmospheric gas.

The heat radiating material 5, melted by heat, surrounds the mounting member 1 to enclose it therein, so that the heat radiating material 5 becomes closely integrated with the mounting member 1. Since the mount surface of the mounting member 1 on which a semiconductor element is mounted contacts the inner surface of the container 4 having low wettability, the mount surface of the mounting member 1 is not covered by the melted heat radiating material 5. When surfaces of the mounting member 1 other than the mount surface are coated with a ferrous metal such as Fe, Ni, Co, or the like, mutual diffusion between the mounting member 1 and the heat radiating member 2 is promoted, so that a stronger and closer joint can be formed.

In the method in which the mounting member 1 is placed in the depression provided in the bottom surface of the container 4, it sometimes becomes difficult to extract a heat sink obtained by integrating the heat radiating member 2 with the mounting member 1. In such cases, a heat resisting spacer 6 having a thickness equal to the amount of projection of the mounting member 1 from the heat radiating member 2 is preferably used.

The heat resisting spacer 6 is provided with an opening corresponding to the size of the mounting member 1, and the mounting member 1 is positioned by insertion into the opening. The heat resisting spacer 6 is made of graphite or ceramics which have low wettability with respect to the molten metal for the container 4. The use of the heat resisting spacer 6 facilitates extraction of the mounting member 1 which is integrated with the heat radiating member 2 by heat joint. Heat resisting spacers 7 may be placed on the inner surface of the side wall of the container 4 for the same purpose.

The use of the spacers 6 and 7 mitigates the restriction on the materials which can be used as the container 4. In other words, the material of the container 4 may be selected only from the viewpoint of heat resisting performance and strength at high temperatures, without taking into account wettability with respect to a molten metal. Also, even when containers 4 having the same internal shape are used, the shapes of obtained heat sinks can be freely changed by changing the layout of the heat resisting spacers 6 and 7. Moreover, since heat sinks having a shape close to a desired final shape are obtained, the number of portions which require machining can be decreased.

As described above, in the heat sink according to the present invention, the portion on which a semiconductor element is mounted and the heat radiating portion are made of different materials. Accordingly, heat generated in the semiconductor element can be efficiently released while reliably maintaining contact with the semiconductor element. In addition, since the mounting portion and heat radiating portion are firmly and closely joined to each other decreasing, heat conductivity can be prevented by eliminating pores which tend to be produced at the juncture interface. Thus, heat is efficiently transferred from the mounting portion to the heat radiating portion. Furthermore, the heat radiating portion is made of a material having excellent machinability such as Cu and Ag, a heat sink having a shape close to a desired final shape can be easily manufactured and the heat sink can be made more lightweight.

Third embodiment:

As a mounting member 1, a tungsten sintered body measuring 5 mm×5 mm×2 mm was manufactured by powder metallurgy. The density of the mounting member 1 was 99% of the theoretical density. The mounting member 1 was placed in a container 4 having a depression formed in the bottom surface to a depth of 1 mm, as shown in FIG. 10A, and the inner space of the container was filled with small chips of Cu.

The entire container 4 was held in a nitrogen atmosphere and was heated to 1300° C. A portion of the Cu melted due to the heat formed a direct joint closely contacting the surface portion within an inter-atom distance. The mounting member 1 and the heat radiating member 2 were firmly and closely joined with each other via the directly joined surfaces, and no defects such as pores were detected at the juncture interface.

The heat radiating performance of the heat sink manufactured in the above-described manner was tested. The heat sink was heated to 100° C. and then cooled. Decrease in temperature of the mounting portion, i.e., cooling speed was measured, and the heat radiating property was judged according to the cooling speed. The cooling speed was 20% higher than that of a heat sink made entirely of tungsten, as measured under the same conditions. It is apparent from this comparison that the heat sink obtained in the present embodiment has high heat radiating performance. In addition, since the coefficient of thermal expansion of the mounting member 1 is close to that of Si, adverse effects due to variations in contact resistance and the like do not appear even at high temperatures.

Fourth embodiment:

Two kinds of mounting members 1 were manufactured in advance using a tungsten green compact having a porosity of 20 vol. % and a composite green compact containing 20 vol. % of Cu and 80 vol. % of W, respectively. The mounting members 1 were integrated with respective heat radiating members 2 in the same manner as in the third embodiment to obtain two kinds of heat sinks according to the present invention.

The heat radiating performance of each heat sink was tested in the same manner as in the third embodiment. For comparison, the heat radiating performance of a comparative heat sink made entirely of a composite material containing 20 vol. % of Cu and 80 vol. % of W was tested. The cooling speed of the comparative sample was about 5% lower than that of the heat sink according to the present invention.

Although the samples manufactured in the third and fourth embodiments have different thermal capacities, it is understood that the heat sinks of the present invention have improved heat radiating performance compared to the comparative samples. As described above, each of the heat sinks according to the present invention provides excellent heat radiating characteristics, so the temperature of a semiconductor element mounted thereon is effectively prevented from rising.

Fifth embodiment:

Two kinds of mounting members 1 were manufactured in advance using a tungsten green compact having a porosity of 20 vol. % and a composite green compact containing 20 vol. % of Cu and 80 vol. % of W. The mounting members 1 were integrated with respective heat radiating members 2 in the same manner as in the third embodiment. Subsequently, they were heated to 200° C. and were subjected to die forging, thereby obtaining two kinds of heat sinks according to the present invention, as shown in FIG. 11A. In this case, accurate shapes could be obtained by die forging only, so that the cutting process could be eliminated or greatly decreased.

For comparison, a comparative heat sink made entirely of a composite material containing 20 vol. % of Cu and 80 vol. % of W was manufactured and formed in the shape shown in FIG. 11A. In this case, since cutting was required to obtain a desired final shape, the yield was low. Also, the comparative heat sink was 30 to 40% heavier than the product of the present invention.

What is claimed is:

1. A substrate for a semiconductor made of a composite alloy metal, comprising:

a first portion comprising a sintered body of a metal powder having a high melting point; and a second portion comprising a filling metal; wherein said sintered body is impregnated with said filling metal, eliminating any requirement for machine finishing;

said metal powder of said sintered body has a grain size composition which includes a combination of a plurality of powder groups having statistically different average grain sizes from group to group; and the powder of each group is dispersed uniformly throughout said sintered body.

2. A substrate for a semiconductor according to claim 1, wherein:

said grain size composition comprises a combination of groups having at least a larger grain size and a smaller grain size, respectively;

said larger grain size is in a range of 7 $\mu$m;

said smaller grain size is in a range of 0.5 $\mu$m to 1.0 $\mu$m; and said grain size composition comprises from 70 vol. % to 80 vol. % of said larger grain size and a balance of said smaller grain size.

3. A substrate for a semiconductor according to claim 1, wherein:

said grain size composition comprises a combination of groups having at least a larger grain size, a middle grain size and a smaller grain size;

said larger grain size is in a range of 7 $\mu$m to 15 $\mu$m;

said middle grain size is in a range of 2 $\mu$m to 4 $\mu$m;

said smaller grain size is in a range of 0.5 $\mu$m to 1.0 $\mu$m; and said grain size composition comprises from 60 vol. % to 80 vol. % of said larger grain size, from 10 vol. % to 25 vol. % of said smaller grain size, and a balance of said middle grain size.

4. A substrate according to claim 1 wherein:

said metal powder comprises a material selected from the group consisting of W and Mo; and said filling material is selected from the group consisting of Cu and Ag.

* * * * *